United States Patent [19]

Schlegel

[11] Patent Number: 5,125,856

[45] Date of Patent: Jun. 30, 1992

[54] CABLE TO PRINTED CIRCUIT BOARD KEYED CONNECTOR SYSTEM

[75] Inventor: Christian Schlegel, Dreieich/Sprenglingen, Fed. Rep. of Germany

[73] Assignee: MAN Roland Druckmaschinen AG, Fed. Rep. of Germany

[21] Appl. No.: 644,703

[22] Filed: Jan. 23, 1991

[30] Foreign Application Priority Data

Jan. 23, 1990 [DE] Fed. Rep. of Germany ....... 4001762

[51] Int. Cl.⁵ ............................................. H01R 13/64
[52] U.S. Cl. ........................................ 439/680; 439/78
[58] Field of Search ............................... 439/53, 76–78, 439/492, 493, 680

[56] References Cited

U.S. PATENT DOCUMENTS

| | | | |
|---|---|---|---|
| 3,771,101 | 11/1973 | Elkins | 439/78 |
| 3,963,301 | 6/1976 | Stark | 439/680 |
| 4,365,857 | 12/1982 | Watanabe et al. | 339/17 |
| 4,398,779 | 8/1983 | Ling | 439/680 |

FOREIGN PATENT DOCUMENTS

| | | |
|---|---|---|
| 0147930B1 | 3/1987 | European Pat. Off. . |
| 308879 | 7/1973 | Fed. Rep. of Germany . |
| 3713262C2 | 2/1989 | Fed. Rep. of Germany . |

Primary Examiner—Paula A. Bradley
Attorney, Agent, or Firm—Leydig, Voit & Mayer

[57] ABSTRACT

A connecting system for making electrical connections between a multiple conductor cable and a printed circuit board. A plurality of connector pins is mounted in a regularly spaced array on the printed circuit board and projecting above a first surface of the board. No other elements are mounted on the printed circuit board which are dedicated solely to the connecting system. Instead, a plurality of electrical components which are mounted on the circuit board for performing circuit functions, are mechanically positioned to surround the pins to provide an internal periphery of predetermined size, shape, and keyed configuration. The keyed periphery closely matches the outer periphery of a connector body attached to the cable. Thus, the electrical components on the circuit board key the connector body to the circuit board such that misplugging is avoided. The elimination of a board mounted connector body, and the close proximity of the electronic components required to perform their keying function, substantially increases circuit board density.

14 Claims, 2 Drawing Sheets

CABLE TO PRINTED CIRCUIT BOARD KEYED CONNECTOR SYSTEM

FIELD OF THE INVENTION

This invention relates to electrical connectors, and more particularly for connecting systems for making electrical connections between a multiple conductor cable and a printed circuit board.

BACKGROUND OF THE INVENTION

Electrical connection systems comprising plugs and sockets are often used to connect printed circuit boards which carry electrical components to multiple conductor cables such as ribbon cables. The plug part of the connection system is mounted directly on the circuit board, and the socket part of the connection system is attached to the cable and electrically connected to the conductors of the cable. When the socket is fit into the plug, electrical connection is made between the circuit board and the equipment connected to the cable.

In high density printed circuit board modules, the connection system often takes the form of a ribbon cable terminated in a miniature connector having an array of connector pins, often disposed in two rows. A large number of signals which can be analog or digital, power supply connections, TTL compatible signals, C-MOS compatible signals, and others can be carried through the connector. Clearly, the connector system must be such that the socket fits into the plug in only one way in order to properly make the connections. If the connector is offset or misrotated with respect to the plug, improper connections can be made, with the possibility not only of equipment malfunction, but also of equipment destruction.

To prevent misplugging due to offsetting or misrotation of the socket with respect to the plug, the socket or plug often have interfitting bodies keyed to allow insertion for connection in only one orientation. Thus, the socket can be configured in a particular shape having an outer periphery, and the plug which is positioned on the printed circuit board can have a frame defining an interfitting outer periphery so that the socket fits into the plug in only one orientation. Coding projections/coding grooves or other keying mechanisms can also be used on the plug, the socket, or both of those elements in order to assure that connection is made in only one orientation.

Such connector systems are used in printed circuit boards but can raise difficulties when a high degree of miniaturization is a requirement. The need for the plug to be configured within an encircling frame which surrounds the socket usually imposes a requirement that a reasonably substantial area beyond the actual connector pins be dedicated to the connection system. In other words, the plug which must be mounted on the printed circuit board, when it carries its own peripheral mating frame for the connector, demands a surface area on the printed circuit board which is substantially larger than the area needed solely for the connections. Furthermore, because the plug which is mounted to the circuit board requires this extra space for the peripheral keying elements, the electronic components on the printed circuit board must be displaced adequately from the plug to allow mounting of the plug on the board without interference from the electrical or electronic components. Thus, the plug not only uses the actual space which it occupies, including the space necessary for the peripheral keying elements, but also requires that electrical components mounted near the plug be displaced from the plug itself, requiring a relatively large circuit board surface area; that is a requirement which can be incompatible with extreme miniaturization when it is desired.

An alternative, of course, is to provide a plug without the encircling peripheral keying elements, but that raises the problem of potentially misconnecting the socket and the plug. As noted above, misorientation can result in improper electrical connections, which in turn leads to circuit malfunction or equipment failure.

Attempts have been made to provide an open plug on a printed circuit board, that is, a plug without an encircling peripheral keying frame element, and to provide some means of keying the connector to the plug. For example, when connectors are of the two-row variety, a different number of connector pins can be disposed in each row, such that the socket fits properly on the plug in only a single orientation. Connectors of this sort are a familiar means of connecting peripheral devices to personal computers.

In addition to the connectors which use different numbers of pins in each of two rows, other keying arrangements have been utilized, such as single or multiple row plugs in which a pin is missing from a particular location in the plug, and the socket has a plugged bore at the corresponding location. If the socket is misaligned, it cannot therefore be plugged onto the plug.

In both of these cases, if one attempts to plug the socket onto the plug in a way which is not allowed by the keying system, the possibility exists of bending of the pins or other deformation of the plug or socket which can destroy the socket, the plug, and perhaps the circuit board. The possibility of damaging elements which are keyed by virtue of rather thin connecting pins and the like is appreciated when one contrasts the insertion or removal force of a plug when properly oriented, with the not-substantially greater force required to damage the plug if it is misoriented. Thus, while in theory such connector pin type keying systems should be adequate for their intended purpose, in many applications they are subject to failure as has been described herein.

Other means are available for assuring that plugs in this environment are properly mated, such as electronic systems which sense connections between desired pins to drive plug-sensing circuitry, and generating an enabling signal only when the plug is properly connected. However, such systems require the dedication of pins in the plug to the connection assurance function, and are not adapted to actually prevent misconnection, but only to signal a misconnection when it is made.

SUMMARY OF THE INVENTION

In view of the foregoing, it is a general aim of the present invention to provide a multiple conductor printed circuit board connecting system which is keyed to assure single orientation connection, which is adapted for high density circuit boards, and which is more mechanically robust than systems which rely on pin position alone.

More particularly, it is an object of the present invention to provide a connecting system which dedicates only upstanding connecting pins disposed in an array on the printed circuit board to the connecting function, utilizes a keyed socket attached to the cable for connection to the printed circuit board, and assures keyed orientation of those elements without the requirement for additional single-function components dedicated to connector keying on the circuit board.

In short, an object of the invention is to employ elements located on the circuit board for the purpose of performing the electrical function to which the circuit board is dedicated, and to employ those elements in the dual role of connector keying means.

In accordance with the invention, there is provided a system for making electrical connections between a multiple conductor cable and a printed circuit board. The system includes a plurality of connector pins mounted in a regularly spaced array on the printed circuit board and projecting above a first board surface. A plurality of electrical components dedicated to the electrical function of the board are also board-mounted. A connector body is attached to the cable and has a plurality of pin-receiving connectors electrically connected to the cable conductors. The pin-receiving connectors are arranged in an array having the same regular spacing as the array of connector pins so that they mate. The body has a nonsymmetrical keyed periphery which has a given orientation with respect to the connector pins. At least some of the components on the printed circuit board project above the first surface and are arranged in a configuration surrounding the pins to define an aperture adapted in size and shape to the periphery of the body to mate the keyed configuration thereof. As a result, misplugging is prevented.

It is a feature of the invention that the amount of surface area of the printed circuit board devoted solely to the connection function is minimized while still providing a rugged keying system which minimizes misplugging.

Other objects and advantages will become apparent from the following detailed description when taken in conjunction with the drawings, in which:

While the invention will be described in connection with a preferred embodiment, there is no intent to limit it to that embodiment. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
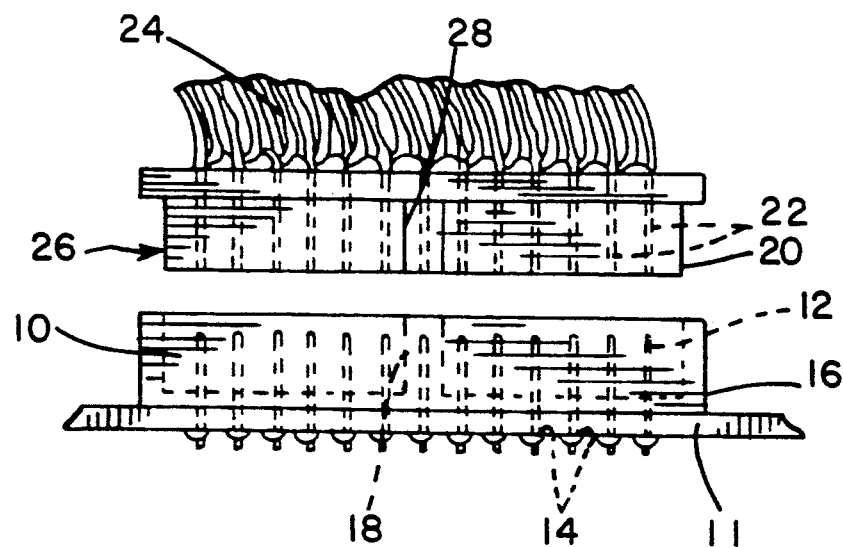
FIG. 1 is an elevational view showing a prior art connector system for connecting a multiple conductor cable to a printed circuit board.
Figure 2:
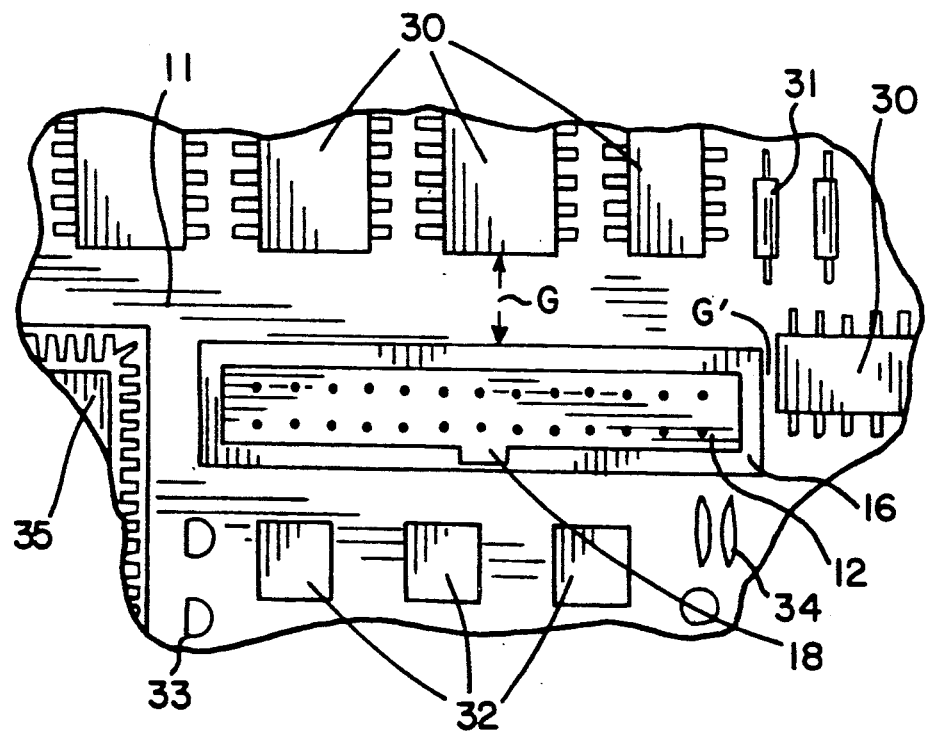
FIG. 2 is a plan view of the system of FIG. 1.

Turning now to the drawings, FIGS. 1 and 2 will first be described in order to adequately illustrate the environment of the present invention. It will be appreciated that FIGS. 1 and 2 illustrate one of the prior art approaches to making connections between multiple conductor cables and printed circuit boards. That prior art system includes a plug 10 mounted on a printed circuit board 11 and having a plurality of connector pins 12 associated therewith. In the illustrated embodiment, the connector pins 12 are located in apertures 14 in the printed circuit board to form a regularly spaced array best illustrated in FIG. 2. Surrounding the array is a frame member 16 which is keyed by notch 18 to define a given orientation for insertion of a socket.

Referring again to FIG. 1, a socket 20 has a plurality of pin-receiving connectors 22 held therein and disposed in an array which mates the array of pin connectors 12. It will be noted at this point that the pins and pin-receiving connectors are located on the board and in the socket, respectively, for purposes of illustration. The functions can clearly be interchanged with the pin-receiving connectors mounted on the circuit board and the pins in the socket. Thus, the terms are intended to be used interchangeably herein both in describing the prior art and in describing the invention, and the distinction is drawn between them solely to show that the elements in the plug and in the socket are not identical, but are adapted to mate one with the other.

Returning to the description of FIG. 2, it is seen that a cable 24 is provided in having individual conductors within the cable connected to respective ones of the pins 22 for making electrical connections through the connector system to the circuit board. The plug 20 has an outer periphery generally indicated at 26 which closely fits within the keyed periphery provided by frame 16 or the plug. Indeed, the illustrated socket 20 also includes a projection 28 adapted to closely fit within key slot 18 to assure that the socket cannot be inserted in the plug misoriented by 180°.

For purposes of completeness, the illustration of FIG. 2 also shows electronic components including integrated circuits 30, passive components such as resistors 31, adjustable trimming components 32 such as potentiometers or variable capacitors, transistors 33, capacitors 34, a large-scale integrated circuit 35 such as a microprocessor. The circuit components are intended to be illustrative of those which might be used with the invention. Of particular significance with respect to the illustration of FIG. 2 is the reasonably large space identified as G which is maintained between the plug 16 and many of the components 30 in order to allow for mechanical assembly of the devices without substantial interference. Even where relatively minor gaps such as G' are provided between a component 30 and the plug 16 (as illustrated at the right of the circuit board 11), it has been the practice to maintain other more substantial gaps at other locations in order to fit the plug in place, fit the components in place, and provide for the necessary tolerance between the respective components in order to produce an operable system. The space required for the plug 16 can be even larger in cases where the plug is of the relatively conventional variety which requires screws or rivets for securement to the printed circuit board. Such screws or rivets are often required because of the relatively substantial insertion or removal forces needed to not only mate the connecting pins, but also to fit the body of the plug within the frame 16.

Figure 3:
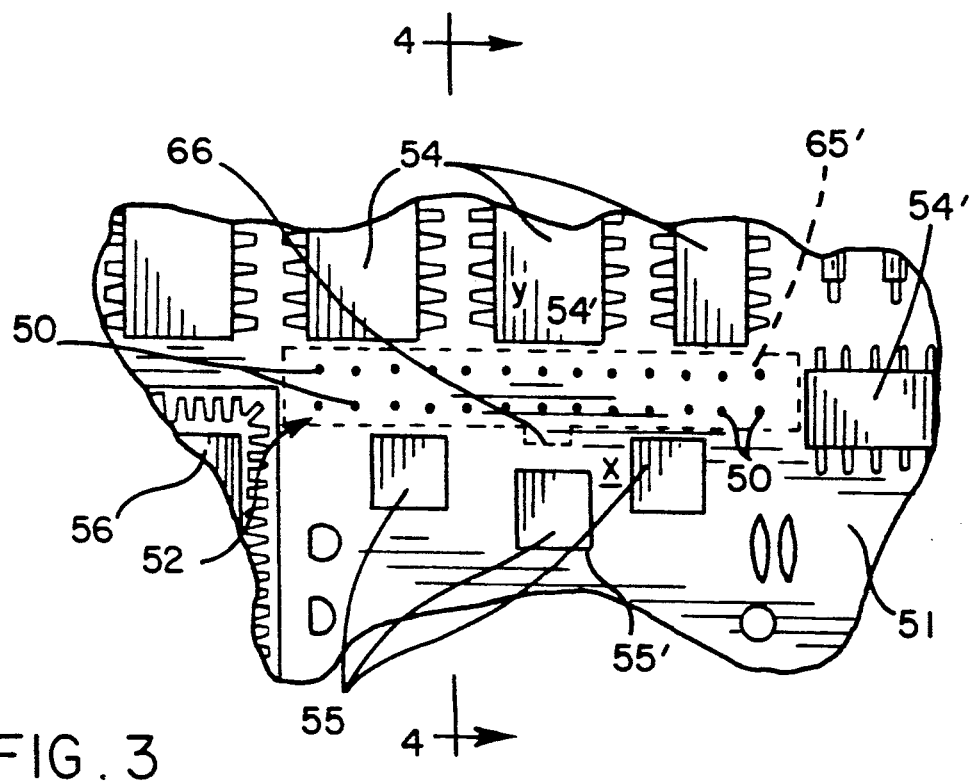
FIG. 3 is a plan view illustrating a connecting system exemplifying the present invention.
Figure 4:
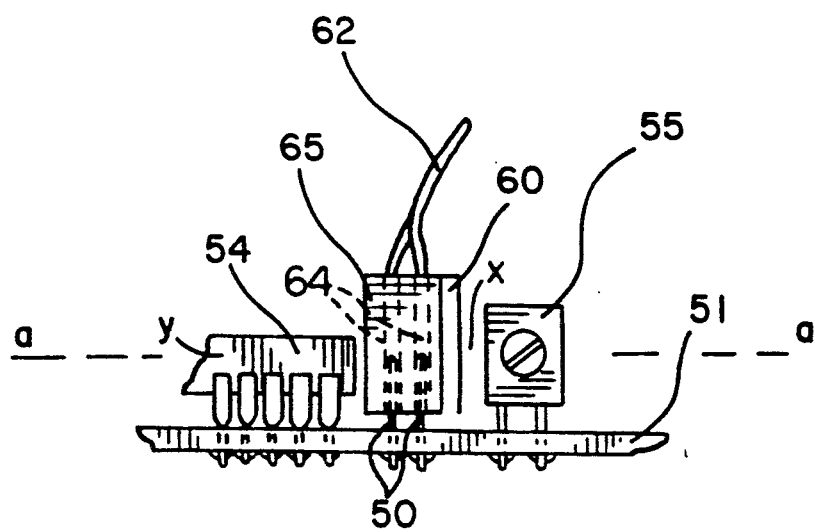
FIG. 4 is a view taken generally along the line 4—4 of FIG. 3 showing the interrelationship between the socket and the keying electrical components.

In accordance with the invention, high density of the components on the printed circuit board is achieved while still providing for the desired keyed interconnection to an external cable by the means illustrated in FIGS. 3 and 4. There is shown a series of connector pins 50 mounted on a printed circuit board 51 and formed in a regularly spaced array 52. The array illustrated in FIGS. 3 and 4 is a two-row array, although other configurations can be utilized when desired. In contrast to the prior art system, however, there is no plug member or frame associated with the array 52 of connector pins 50, those pins stand on the printed circuit board unprotected by any elements dedicated solely to the connector.

In practicing the invention, keying means are provided for the array of pins by means of the electronic components which are carried on the circuit board for performing the electrical functions to which the circuit board is dedicated. Thus, elements such as dual-in-line integrated circuits 54, trim potentiometers or trim capacitors 55, large-scale integrated circuits 56 such as microprocessors, and the like are spaced with respect to the array 52 of pins 50 to provide keying means for the socket of the connecting system. The socket (or connector body) is illustrated at 60 in FIG. 4 and is seen to be attached to a multiple conductor cable 62, the conductors of which are connected to pin-receiving connectors 64 held in a body 65 of the socket 60. The pin-receiving connectors 64 are held in the socket 60 in a regularly spaced array which matches the array 52 of pins on the printed circuit board 51. The drawings also illustrate the manner in which the keying electrical components are disposed adjacent the array 52 of pins 50 to provide the connector keying arrangement. Thus, the integrated circuits 54 are disposed in a line which runs along one side of the socket and provide an abutment for that side. Similarly, large-scale integrated circuit 56 and integrated circuit 54' are disposed at left and the right of the array of pins to provide locating means for the plug in that location. In the illustrated embodiment, the trimming components 55 are also disposed in a line, but with one member, the central trimming component 55' in the illustrated embodiment, being offset to key with a projection 66 which is formed on the body 65 of the plug. The trimming components 55 at the left and right of the central component 55' can clearly be moved closer together in order to more closely fit the projection 66, if necessary. However, the necessity for close or loose keying is dependent upon the number and types of connectors used in any system, and the system illustrated in FIGS. 3 and 4 is believed to be typical for many uses.

The dashed line 65' in FIG. 3 is intended to illustrate the periphery of the body 65 of the connector, and its interrelationship to the array 52 of pins 50 and the electrical or electronic components which surround that array. The line 65; however, does not imply any additional structure on the circuit board 51 dedicated solely to the connecting system function.

It will be appreciated upon an examination of FIGS. 3 and 4 that the socket 60 can be inserted onto the pins 50 in only one orientation, even though the pins are the only elements dedicated solely to the connection function on the printed circuit board. The electrical and electronic components which have a primary electrical function for which the circuit board is dedicated, are configured to provide a secondary function of keying the socket 60 to the array of connector pins to prevent misalignment or misplugging. A comparison of FIGS. 2 and 3 will given an indication of the amount of area of the printed circuit board which can be saved by utilization of the present invention. While the saving is not extremely large in terms of square centimeters, in modern electronic equipment where miniaturization can be of very substantial commercial significance, the advance attributable to the invention can be significant in many cases.

The relative positioning of the central trimming component 55 with respect to its partners and the central integrated circuit 54 with respect to its partners is significant in the illustrated implementation of the invention. More particularly, all of the integrated circuits 54 form a straight line, whereas the central trimming component 55' is displaced from its partners 55 in order to provide a gap X adapted to provide space for insertion of the key 66. If the plug is rotated 180°, it will be seen that the central integrated circuit 54' will produce an interference and prevent insertion of the plug.

It is also worthy of note, as best illustrated in FIG. 4, that the length of pins and pin-receiving connectors is such that no electrical connection is made if an interference is encountered when attempting to fit the socket into the plug. More particularly, the pins 50 are shown as projecting above the upper surface of the printed circuit board, as illustrated by the dashed line a—a. Thus, the pins 50 terminate below the lowest of the electrical components which provide the connector keying function. Thus, if one attempts to insert the socket 60 into the plug in an improper orientation, a lower portion of the plug body 65 will interfere with the electrical component which provides the keying function before any contact between the pins 50 and pin-receiving connectors 64 is made. Thus, even if one attempts to connect the plug and socket when the system is powered up, there is no danger of malfunction or circuit destruction since electrical connections are thus prevented.

It is also worthy of note that the electrical and electronic components such as the dual-in-line packages and trimming components which form the keying elements for the socket are advantageously components which have a mechanically tight fit on the circuit board 51. Thus, the integrated circuits 54 which are often configured as dual in-line packages have multiple connections to the circuit board and thus are secure with respect to the surface of the circuit board for providing the keying function. The mechanical trimming components 52 also are usually configured with solid base support because those elements are adapted for mechanical manipulation during trimming of the electrical circuit. Thus, such components are generally preferred as compared with less stable components such as disc capacitors whose orientation with respect to the printed circuit board might be changed by mechanical force applied either directly or by means of the socket.

The fact that the electrical components which are used for the keying means are usually standardized within a line or by manufacturer allows the use of such components for the keying operation. There should be no problem, for example, with dual-in-line packages which are made to precise standards industry-wide. Even trimming components, when specified to be those of a particular manufacturer, are provided with relatively precise external case dimensions with respect to the pin-out locations which mount them to the printed circuit board. Thus, when a particular set of components is selected and positioned on the board, it can be expected that the keying arrangement for the socket which s thus provided will remain reliable over the life of manufacture of the board, without being changed from lot to lot or year to year over the life of the product.

It will also be apparent that while the invention has been described in connection with two-row ribbon connectors, it can also be used to prevent misplugging of single row or other multiple row plug pin arrangements, sometimes known as matrix plugs. The invention can also be applied to plug-pin arrangements where the spacing between the pins differ, and in its broadest sense the description of the pins as being configured in a regular array is intended to encompass such an arrangement. When desired, the projecting keys 66 and the coding groove which it mates can be eliminated, particularly if the outer periphery 65' of the socket part is extended asymmetrically to or offset from the array 52 of pins 50.

It will thus be appreciated that what has been provided is a connecting system for a printed circuit board which allows connection of a multiple conductor cable to the board in a manner which provides both security and maximization of board density. The only components on the printed circuit board which are dedicated solely to the connecting function are the pins which actually form the connections. All keying is accomplished by electrical components already on the circuit board for performing other electrical functions. Those components are arranged with respect to the array of pins to form an aperture which mates the periphery of a socket attached to the cable, such that the socket can fit the array of pins within the aperture in only a single orientation, thus preventing misplugging.

What is claimed is:

1. A system for making electrical connections between a multiple conductor cable and a printed circuit board comprising, in combination:
   a plurality of connector pins mounted in a regularly spaced array on the printed circuit board and projecting above a first surface thereof,
   a plurality of electrical components mounted on the printed circuit board,
   a connector body attached to the cable and having a plurality of pin-receiving connectors electrically connected to the cable conductors, the connectors being arranged in an array having the same regular spacing as the array of connector pins, the body having a nonsymmetrical keyed periphery which has a given orientation with respect to the pin-receiving connectors, and
   at least some of the components projecting above the first surface of the printed circuit board and being arranged in a configuration surrounding the pins to define an aperture adapted in size and shape to said periphery to mate the keyed configuration of the body, thereby to prevent misplugging.

2. The combination as set forth in claim 1 wherein the body has a coding projection at a predetermined location on said periphery, at least some of the components defining a line adapted to mate said periphery, and one of the components defining said line being offset to provide a mating space for said coding projection.

3. The combination as set forth in claim 1 wherein the length of the pins above the first surface of the printed circuit board is less than the projection above the first surface of said at least some of the components.

4. The system as set forth in claim 1 wherein the array of connector pins comprises a two-row array of pins equally spaced within each row.

5. The combination as set forth in claim 4 wherein the body has a coding projection at a predetermined location on said periphery, at least some of the components defining a line adapted to mate said periphery, and one of the components defining said line being offset to provide a mating space for said coding projection.

6. The combination as set forth in claim 1 wherein the regular spacing of the array of pins comprises equidistant spacing between pins.

7. The combination as set forth in claim 6 wherein the length of the pins above the first surface of the printed circuit board is less than the projection above the first surface of said at least some of the components.

8. A connecting system for making electrical connections between a multiple conductor cable and a printed circuit board comprising, in combination:
   an array of connector pins mounted on the printed circuit board and projecting above a first surface thereof, said array of connector pins being the only components on said circuit board provided solely for said connecting system,
   a plurality of electrical components mounted on the printed circuit board, said components being connected in an electrical circuit on said printed circuit board,
   at least some of said components projecting above the first surface of the printed circuit board and serving as keying means for said connecting system,
   said at least some of said components providing an aperture defining a periphery of predetermined size and shape specially configured for said connecting system, and
   a connector body attached to the cable and having a plurality of pin-receiving connectors arranged in an array matching the array of connector pins, the connector body having a periphery which closely matches the periphery defined by said components, whereby the components key the body to the pins projecting from the printed circuit board.

9. The combination as set forth in claim 8 wherein the body has a coding projection at a predetermined location on said periphery, at least some of the components defining a line adapted to mate said periphery, and one of the components defining said line being offset to provide a mating space for said coding projection.

10. The combination as set forth in claim 8 wherein the length of the pins above the first surface of the printed circuit board is less than the projection above the first surface of the components.

11. The system as set forth in claim 8 wherein the array of connector pins comprises a two-row array of pins equally spaced within each row.

12. The combination as set forth in claim 11, wherein the body has a coding projection at a predetermined location on said periphery, at least some of the components defining a line adapted to mate said periphery, and one of the components defining said line being offset to provide a mating space for said coding projection.

13. The combination as set forth in claim 8 wherein the array of pins comprises a regular array of equally spaced pins.

14. The combination as set forth in claim 13 wherein the length of the pins above the first surface of the printed circuit board is less than the projection above the first surface of the components.

* * * * *